(12) United States Patent
Kwok et al.

(10) Patent No.: US 10,481,974 B2
(45) Date of Patent: Nov. 19, 2019

(54) APPARATUS, NON-VOLATILE MEMORY STORAGE DEVICE AND METHOD FOR DETECTING DRIFT IN NON-VOLATILE MEMORY

(71) Applicant: INTEL CORPORATION, Santa Clara, CA (US)

(72) Inventors: Zion S. Kwok, Vancouver (CA); Santhosh K. Vanaparthy, Santa Clara, CA (US); Ravi H. Motwani, San Diego, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/636,635

(22) Filed: Jun. 28, 2017

(65) Prior Publication Data

US 2019/0004893 A1    Jan. 3, 2019

(51) Int. Cl.
| | |
|---|---|
| *G06F 11/00* | (2006.01) |
| *G06F 11/10* | (2006.01) |
| *G11C 16/34* | (2006.01) |
| *G11C 11/56* | (2006.01) |
| *G11C 16/10* | (2006.01) |

(52) U.S. Cl.
CPC ........ *G06F 11/106* (2013.01); *G06F 11/1012* (2013.01); *G06F 11/1072* (2013.01); *G11C 16/3418* (2013.01); *G11C 16/3431* (2013.01); *G11C 16/3459* (2013.01); *G11C 11/5628* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 7,809,997 B2 * | 10/2010 | Mori | ................. G06F 21/73 |
| | | | 714/718 |
| 9,691,492 B1 | 6/2017 | Querbach et al. | |
| 10,256,842 B2 | 4/2019 | Kwok | |
| | (Continued) | | |

OTHER PUBLICATIONS

U.S. Appl. No. 14/998,240, entitled "Memory Circuit Defect Correction", filed Dec. 23, 2015, invented by R.H. Motwani, et at, 3 pp.
(Continued)

*Primary Examiner* — Daniel F. McMahon
(74) *Attorney, Agent, or Firm* — Konrad Raynes Davda & Victor LLP; David W. Victor (57) ABSTRACT

Provided are an apparatus, non-volatile memory storage device and method for detecting drift in in non-volatile memory. A determination is made as to whether bits to write have more of a first value than a second value. Each of the bits are flipped to another of the first or second value when the bits have more of the first value than the second value. Indication is made whether the bits were flipped or not flipped. Parity is calculated for the bits and the bits and the parity for the bits are written to a location in the non-volatile memory. The bits at the location in the non-volatile memory are read and each of the bits having the first value are flipped to the second value and each of the bits having the second value are flipped to the first value in response to indication that the bits were flipped.

25 Claims, 8 Drawing Sheets

(56) References Cited

U.S. PATENT DOCUMENTS

| | | | |
|---|---|---|---|
| 2010/0165730 A1* | 7/2010 | Sommer | G06F 11/1068 |
| | | | 365/185.03 |
| 2014/0068365 A1* | 3/2014 | Chen | G06F 11/106 |
| | | | 714/746 |
| 2015/0317203 A1* | 11/2015 | Zhou | G06F 11/1044 |
| | | | 714/773 |
| 2017/0093439 A1* | 3/2017 | Motwani | H03M 13/45 |
| 2017/0186500 A1 | 6/2017 | Motwani et al. | |

OTHER PUBLICATIONS

U.S. Appl. No. 15/059,642, entitled "Technologies for Correcting Flipped Bits for an Error Correction Decode Process", filed Mar. 3, 2016, invented by Z.S. Kwok, et al., 43 pp.

\* cited by examiner

APPARATUS, NON-VOLATILE MEMORY STORAGE DEVICE AND METHOD FOR DETECTING DRIFT IN NON-VOLATILE MEMORY

TECHNICAL FIELD

Embodiments described herein generally relate to an apparatus, non-volatile memory storage device and method for detecting drift in in non-volatile memory.

BACKGROUND

Solid state storage devices (for example, solid state drives or SSDs) may be comprised of one or more packages of non-volatile memory dies implementing NAND memory cells, where each die is comprised of storage cells, where storage cells are organized into pages and pages are organized into blocks. Each storage cell can store one or more bits of information. Over time, a threshold voltage or resistance drift may occur in the memory cells where the resistance of the memory cells increases. As drift occurs, the read voltage used in the early life of the SSD is unable to read the data in the NAND memory cells. As resistance increases, a higher read voltage is applied to read data from the non-volatile memory cells. Other types of memory devices, such as phase change memory (PCM) cells, can experience drift, and may require a use of a higher read voltage if a memory cell has not been written within a predetermined time.

There is a need in the art for improved techniques for detecting drift in memory cells.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

For non-volatile memory cells that experience drift, such as three dimensional crosspoint memory cells, the cells can be read within a threshold time during which drift is unlikely to occur using a low or safe demarcation voltage. If bits are read after the threshold time, after which drift is likely, there is a risk that the set values (1s) have drifted to reset values (0s) and will be read incorrectly with the low demarcation voltage, which will read 0 values when 1s were written. For this reason, a higher demarcation voltage is used to read bits that have drifted. However, this higher demarcation voltage may be unsafe for reading if drift has in fact not occurred because the higher demarcation voltage may write 1s to the 0 values if there is no drift.

One technique to determine whether drift has occurred where the higher unsafe demarcation voltage needs to be used is to read using the lower safe demarcation voltage and if an uncorrectable Error Correction Code (ECC) error is detected, then the bits are re-read with the higher unsafe demarcation voltage.

Another technique for determining whether there is drift that warrants use of the higher demarcation voltage, is to track an elapsed time, and if the elapsed time has passed since the data was written, then the higher unsafe demarcation voltage is used. This technique requires a clock and counter to determine an elapsed time for triggering use of the higher unsafe demarcation voltage.

Another technique estimates the time that drift has occurred by reading a sample of codewords and extrapolates that other codewords in adjacent cells will have a similar drift.

Described embodiments provide techniques implemented in a computer non-volatile memory device to detect drift and determine whether to use the higher unsafe demarcation voltage by encoding bits to write to have more set values (1s) than reset values (0s). Because values drift from 1s to 0s, when reading the bits encoded with more 1s, if more 0s are later read, then drift is detected. Upon detecting the drift during a read, i.e., more 0s than 1s using the lower safe demarcation voltage, ECC decoding may be aborted and the bits may be re-read with the higher unsafe demarcation voltage. This reduces read latency by aborting ECC decoding operations, which may be time consuming. Further, after re-reading with the higher unsafe demarcation voltage, ECC decoding is terminated upon counting more 0s than 1s and the bits are marked as uncorrectable. This further reduces latency after reading with the higher unsafe demarcation voltage by terminating ECC decoding and moving quicker to marking the bits as uncorrectable.

Thus, described embodiments, reduce read latency by reducing latency of ECC decoding operations in a computer non-volatile memory where the memory cells experience drift. The described embodiments also check for silent data corruption (SDC) when bits transition from 1 to 0, resulting in the codeword being marked uncorrectable even if decoded.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 1:
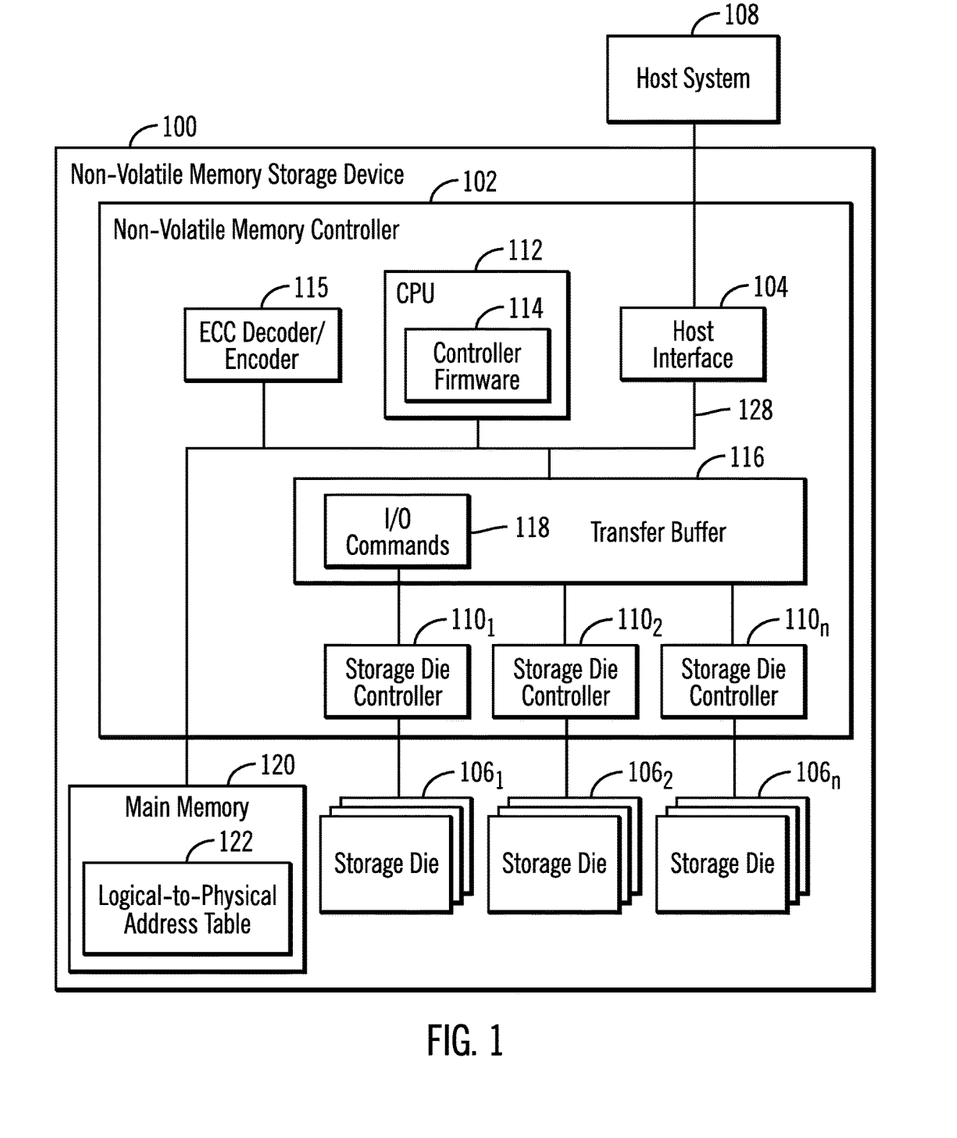
FIG. 1 illustrates an embodiment of a non-volatile memory storage device.

FIG. 1 illustrates an embodiment of a non-volatile memory storage device 100 having a non-volatile memory controller 102, including a host interface 104 to transfer blocks of data and I/O commands between a plurality of groups of storage dies $106_1$, $106_2$ ... $106_n$, comprising a non-volatile memory of storage cells that may be organized into pages of storage cells, where the pages are organized into blocks, and a connected host system 108. The non-volatile memory storage device 100 includes storage die controllers $110_1$, $110_2$ ... $110_n$ that manage read and write requests to blocks of data in pages of storage cells to groups of the storage dies $106_1$, $106_2$ ... $106_n$ and the transfer of data between the transfer buffer 116 and the storage dies $106_1$, $106_2$ ... $106_n$.

The non-volatile memory storage device 100 may function as both a memory device and/or a storage device (for example, a Solid State Drive (SSD)) in a computing system, and may be used to perform the role of volatile memory devices and non-volatile storage media in a computing system. In an embodiment, the non-volatile memory storage device 100 may comprise a non-volatile memory storage device.

The non-volatile memory controller 102 may include a central processing unit (CPU) 112 implementing controller firmware 114, also referred to as a memory controller, managing the operations of the non-volatile memory storage device 100; an error correction code (ECC) decoder/encoder 115; and a non-volatile transfer buffer 116 comprising a non-volatile memory device to cache and buffer transferred Input/Output ("I/O") commands 118 and data between the host 108 and storage dies $106_1$, $106_2$ ... $106_n$. The transfer buffer 116 may comprise a Static Random Access Memory (SRAM) or other suitable volatile or non-volatile memory storage device.

The ECC decoder/encoder 115 may encode and decode data between the CPU 112 and the storage dies $106_1$, $106_2$, $106_3$, and may comprise hardware logic, e.g., logic gates, implemented in one or more Application Specific Integrated Circuits (ASICs). Alternatively, the ECC decoder/encoder 115 may be implemented in the controller firmware 114. The ECC decoder/encoder 115 communicates with the transfer buffer 116 and/or storage die controllers $110_1$, $110_2$ ... $110_n$ to perform ECC encoding of data to be written to the storage dies $106_1$, $106_2$ ... $106_n$ and ECC decoding of blocks of data read from the storage dies $106_1$, $106_2$ ... $106_n$.

A main memory 120 stores a logical-to-physical address table 122 providing a mapping of logical addresses to which I/O requests are directed and physical addresses in the storage dies $106_1$, $106_2$ ... $106_n$ at which the data for the logical addresses are stored The logical addresses may comprise logical block address (LBAs) or other logical addresses known in the art.

In certain phase change memory (PCM) and other memory and storage embodiments, the first voltage level may comprise a safe demarcation voltage or operating voltage valid during a primary usage period. Over time values of storage cells set to the set value, such as 1, may drift to the reset value, or zero. When such drift is detected in the read bits, a higher voltage, such as the second voltage level or unsafe demarcation voltage, may be needed to use as the reference voltage if drift is detected.

In one embodiment, the memory device, such as including the storage dies $106_1$, $106_2$ ... $106_n$, transfer buffer 116, and main memory 120, may comprise a block addressable memory device, such as those based on NAND or NOR technologies. A memory device may also include future generation nonvolatile devices, such as a three dimensional crosspoint (3D crosspoint) memory device, or other byte addressable write-in-place nonvolatile memory devices. In some embodiments, 3D crosspoint memory may comprise a transistor-less stackable cross point architecture in which memory cells sit at the intersection of word lines and bit lines and are individually addressable and in which bit storage is based on a change in bulk resistance. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. The storage dies $106_1$, $106_2$ ... $106_n$, transfer buffer 116, and main memory 120 may comprise different types of memory devices, where the storage dies $106_1$, $106_2$ ... $106_n$ provide more storage space than the transfer buffer 116, which provides a cache for the storage dies $106_1$, $106_2$ ... $106_n$, and the main memory 120, which stores information used for processing I/O requests. The transfer buffer 116 may comprise an SRAM; and the main memory 120 may comprise a Dynamic Random Access Memory (DRAM), which may be battery backed-up, or a 3D crosspoint memory. In certain embodiments, the main memory 120 may comprise a non-volatile memory storage device 100 of the described embodiments within another non-volatile memory storage device 100.

The host interface 104 connects the non-volatile memory storage device 100 to a host system 108. The non-volatile memory storage device 100 may be installed or embedded within the host system 108, such as shown and described with respect to element 1108 or 1110 in FIG. 11, or the non-volatile memory storage device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The CPU 112, host interface 104, ECC decoder/encoder 115, and transfer buffer 116 may communicate over one or more bus interfaces 128, such as a PCIe or other type of bus or interface. Data may be transferred among the host interface 104, CPU 112, and transfer buffer 116 over the bus 128 using Direct Memory Access (DMA) transfers, which bypass the CPU 112. Alternatively, the CPU 112 may be involved in transferring data among the host interface 104, transfer buffer 116, and storage dies $106_1$, $106_2$ ... $106_n$ over the bus 128. In FIG. 1, the connection between the units is shown as a bus 128. In alternative embodiments the connection among any of the components 104, 112, 116, and 120 may comprise direct lines or paths and not a shared bus.

Figure 2:
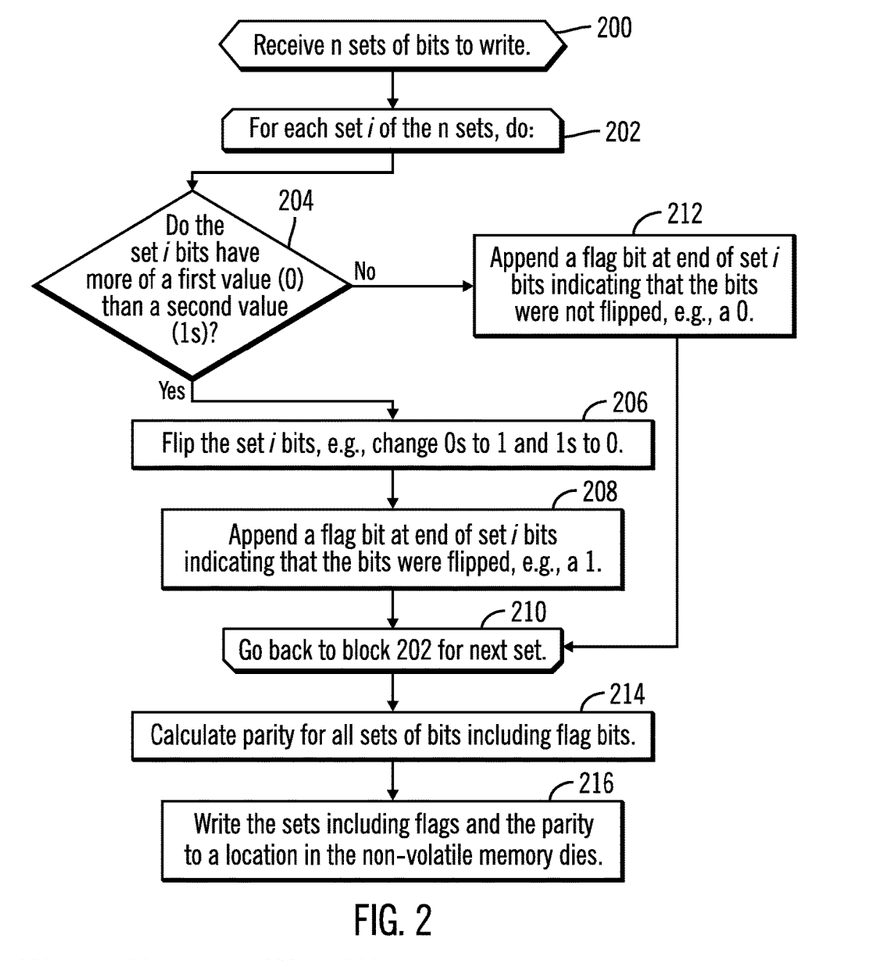
FIGS. 2, 4, and 6 illustrate embodiments to write n sets of bits to a non-volatile memory.

FIG. 2 illustrates an embodiment of operations performed by the ECC encoder/decoder 115 to encode n sets of bits to write. Each set of bits may comprise any number of bits, such as the two sets of bits, 8 bits each, shown in FIGS. 3, 5, 9, and 10 or two sets of twelve bits shown in FIG. 7.

Alternatively, each set of bits may have any number of bits. For instance, in certain applications the sets of bits may each comprise 4096 bits. Upon receiving (at block 200) n sets of bits to write, a loop of operations is performed at blocks 202 through 210 for each received n sets of bits, where there may be one or more received sets. If (at block 204) the received bits have more of a first value, such as a reset value or 0, than a second value, such a set value or 1 (where drift occurs from the second value to the first value), then the set i bits are flipped (at block 206), which means 0s are changed to 1s and 1s are changed to 0s. A flag is then appended (at block 208) to the end of the set i of bits indicating whether the bits were flipped, where a 0 may indicate not flipped and a 1 may indicate flipped. If (at block 204) the set i of bits have more of the second value than the first value, then a flag bit is appended (at block 212) to the end of the set i of bits indicating that the bits were not flipped, e.g., a 0. After determining whether to flip and flipping any sets having more 0s than 1s, the parity is calculated (at block 214) for all the bits in the one or more sets and the sets including flags indicating flipping and parity data are written (at block 216) to a location in the non-volatile memory storage dies $106_1$, $106_2 \ldots 106_n$.

Figure 3:
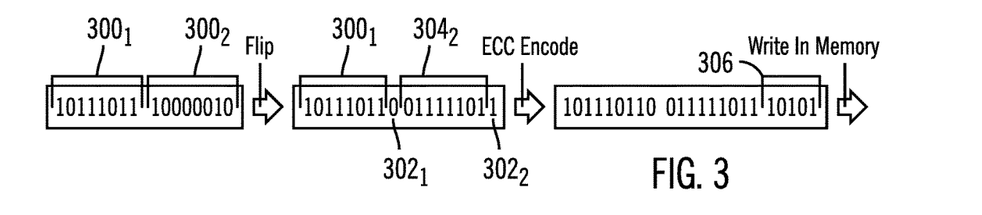
FIGS. 3, 5, and 7 illustrate examples of writing sets of bits as performed in the embodiments of FIGS. 2, 4, and 6, respectively.

FIG. 3 illustrates an example of the writing operation of FIG. 2 where there are two sets of bits $300_1$, $300_2$. The first set $300_1$ has more 1s and the second set $300_2$ has more 0s. Applying the operations of FIG. 2, the first set $300_1$ of bits are not flipped and the flag $302_1$ is appended to the first set of bits $300_1$ having a value of 0 indicating no flipping. The second set of bits $300_2$, having more 0s than 1s, are flipped to produce a flipped set of bits $304_2$ with an appended flag $302_2$ with a value of 1 indicating the bits were flipped. Parity is then calculated from the sets of bits $300_2$, $304_2$ including flags $302_1$, $302_2$ to produce parity bits 306 to append to the end of the sets of bits $300_2$, $304_2$ including flags $302_1$, $302_2$ to then write to the non-volatile memory storage dies $106_1$, $106_2 \ldots 106_n$.

With the embodiments of FIGS. 2 and 3 where drift occurs from 1s to 0s in the storage cells, encoding the bits to write to have more 1s than 0s by flipping the bits allows drift to be detected because, upon reading the bits, if there are more 0s than 1s, then drift is detected because more is were written. Described embodiments thus provide an optimized manner for the computer technology of memory controllers to detect drift in the bits written to a memory device.

In described embodiments a flag appended to the end of a set of bits is used to indicate whether the bits were flipped or not flipped. In alternative embodiments, different techniques and codes other than flags appended to the end of the bits may be used to indicate whether the bits are flipped or not flipped.

Figure 4:
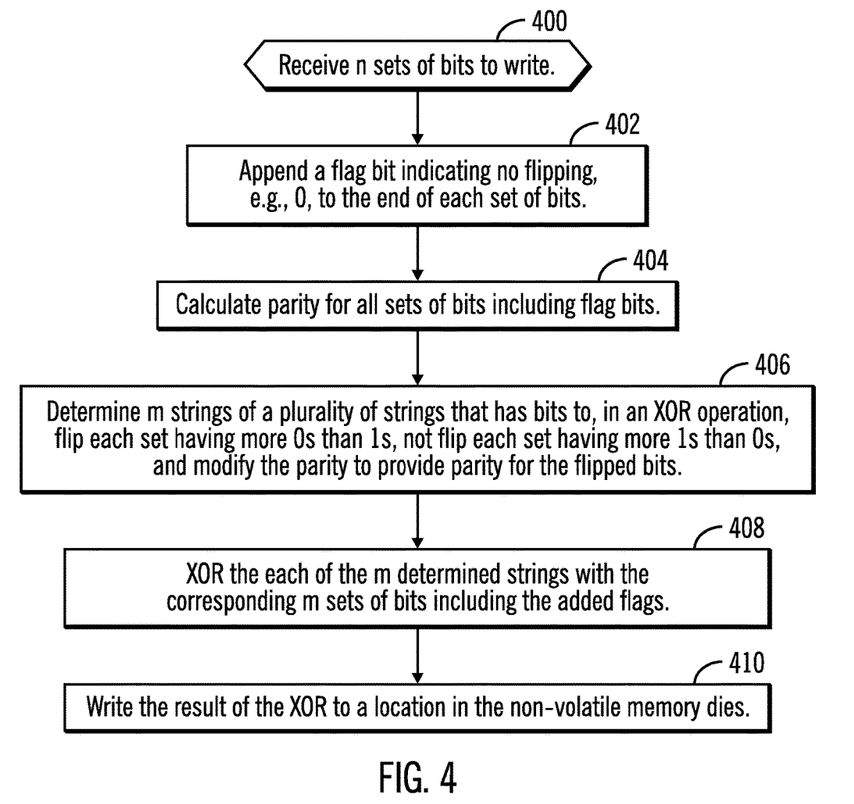

FIG. 4 illustrates an alternative embodiment of operations performed by the encoder/decoder 115 to encode n sets of bits to write. Upon receiving (at block 400) n sets of bits to write, a flag bit is appended (at block 402) to the end of each of the sets of bits indicating no flipping, e.g., 0. Parity is calculated (at block 404) for all the bits in the one or more sets and the appended flags indicating no flipping, e.g., 0. The encoder/decoder 115 determines (at block 406) m strings of a plurality of n strings that has bits to flip, in an XOR, operation the bits in each set having more 0s than 1s, not flip the bits in each set having more 1s than 0s, and modify the parity to provide parity based on the sets having bits flipped and not flipped. The encoder/decoder 115 may maintain a string for every different possible combination of flipping or not flipping each of the sets of bits and to modify the parity to provide parity based on whether bits were flipped. Thus, if there are n sets of bits, there would be n possible strings to select depending on whether each set of bits in the received string is flipped or not flipped. In this way, a series of m XOR operations with the m sets of bits are performed. The determined m strings are XOR'd (at block 408) with each of the sets of bits including the appended flag bits and parity, and the result of the XOR operation is written (at block 410) to a location in the non-volatile memory storage dies $106_1$, $106_2 \ldots 106_n$.

Figure 5:
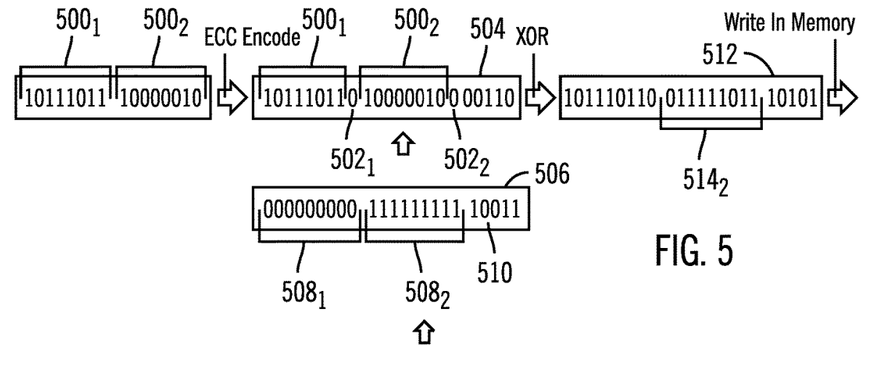

FIG. 5 illustrates an example of the writing operation of FIG. 4 where there are two sets of bits $500_1$, $500_2$. FIG. 5 shows both the first $500_1$ and second $500_2$ sets of bits having more 1s than 0s, and thus having flag bits $502_1$ and $502_2$ set to 0. The parity 504 is calculated based on the sets $500_1$, $500_2$ and appended flags $502_1$, $502_2$. A string 506 is selected that has a first portion $508_1$ of all 0s to not flip the bits in the first set $500_1$, which as more 1s than 0s, and a second portion $508_2$ of all 1s to flip the bits in the second set $500_2$ which has more 0s than 1s, and parity bits 510 to modify the parity 504 based on the flipping to the second set $500_2$. The result 512 of XOR'ing with flipped bits $514_2$ is written to the non-volatile memory.

Figure 6:
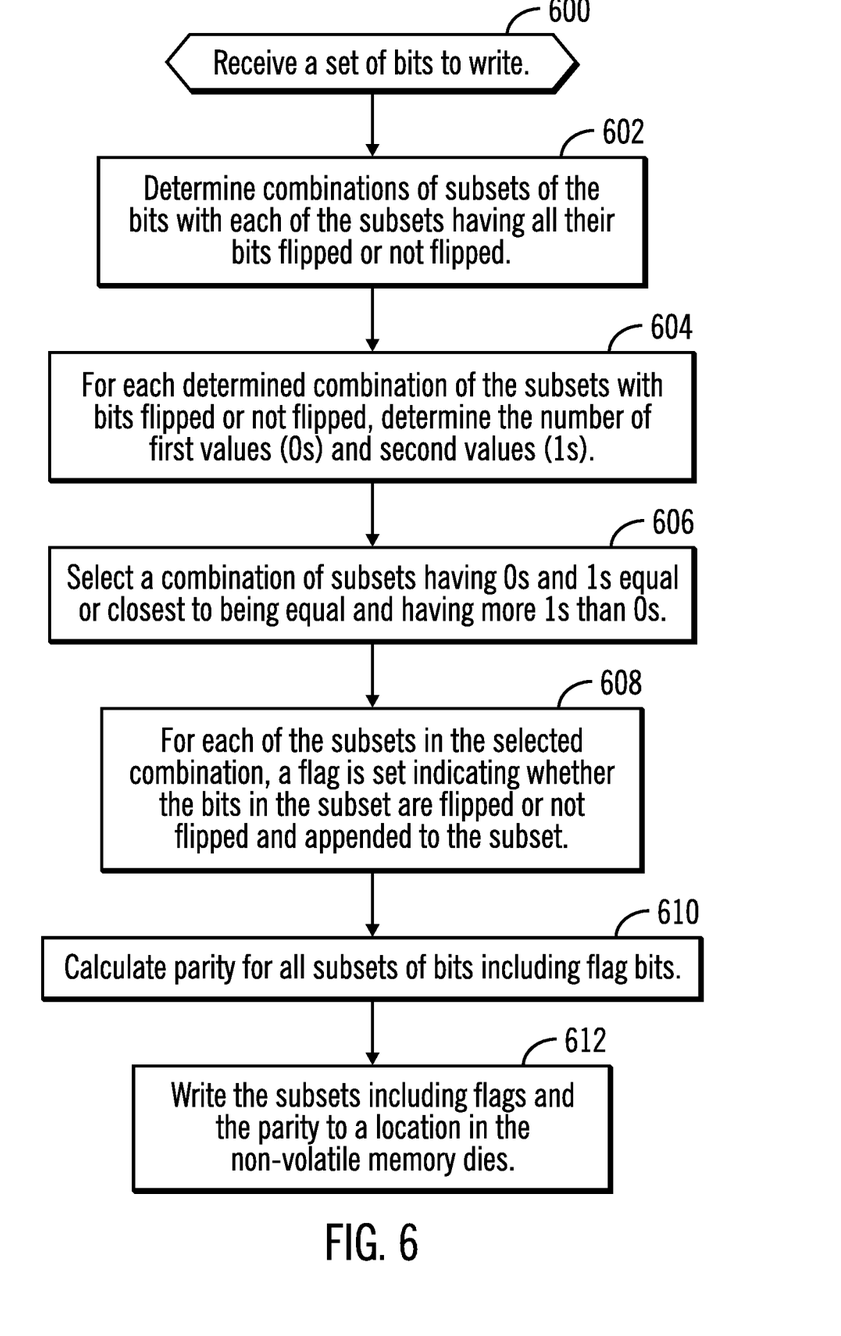

FIG. 6 illustrates a further alternative embodiment of operations performed by the encoder/decoder 115 to encode a set of bits, which may be one of multiple n sets. Upon receiving (at block 400) a set of bits to write, the encoder/decoder 115 determines (at block 602) combinations of subsets of the set of bits having all their bits flipped or not flipped. For example, if the set of bits has three subsets of A, B, and C, there would be $2^3$ or eight combinations of flipping and not flipping the different subsets A, B, and C, including (A, B, C); (A, B, flip C); (A, flip B, C); (A, flip B, flip C); (flip A, B, C); (flip A, B, flip C); (flip A, flip B, C); and (flip A, flip B, flip C). For each determined combination of the subsets with bits flipped or not flipped, a determination is made (at block 604) of the number of first values (0s) and second values (1s). The combination of the subsets is selected (at block 606) having a number of 0s and 1s equal or closest to being equal and having more 1s than 0s. If multiple combinations have the same number of 0s and 1s closest to being equal, one of the combinations may be selected that flips a fewest number of the subsets. For each of the subsets in the selected combination, a flag is set (at block 608) indicating whether the bits in the subset are flipped or not flipped and the flag is appended to the subset. Parity is calculated (at block 610) for all the subsets of bits including the appended flag bits. The subsets including flag bits and the parity are written (at block 612) to a location in the non-volatile memory storage dies $106_1$, $106_2 \ldots 106_n$.

Figure 7:
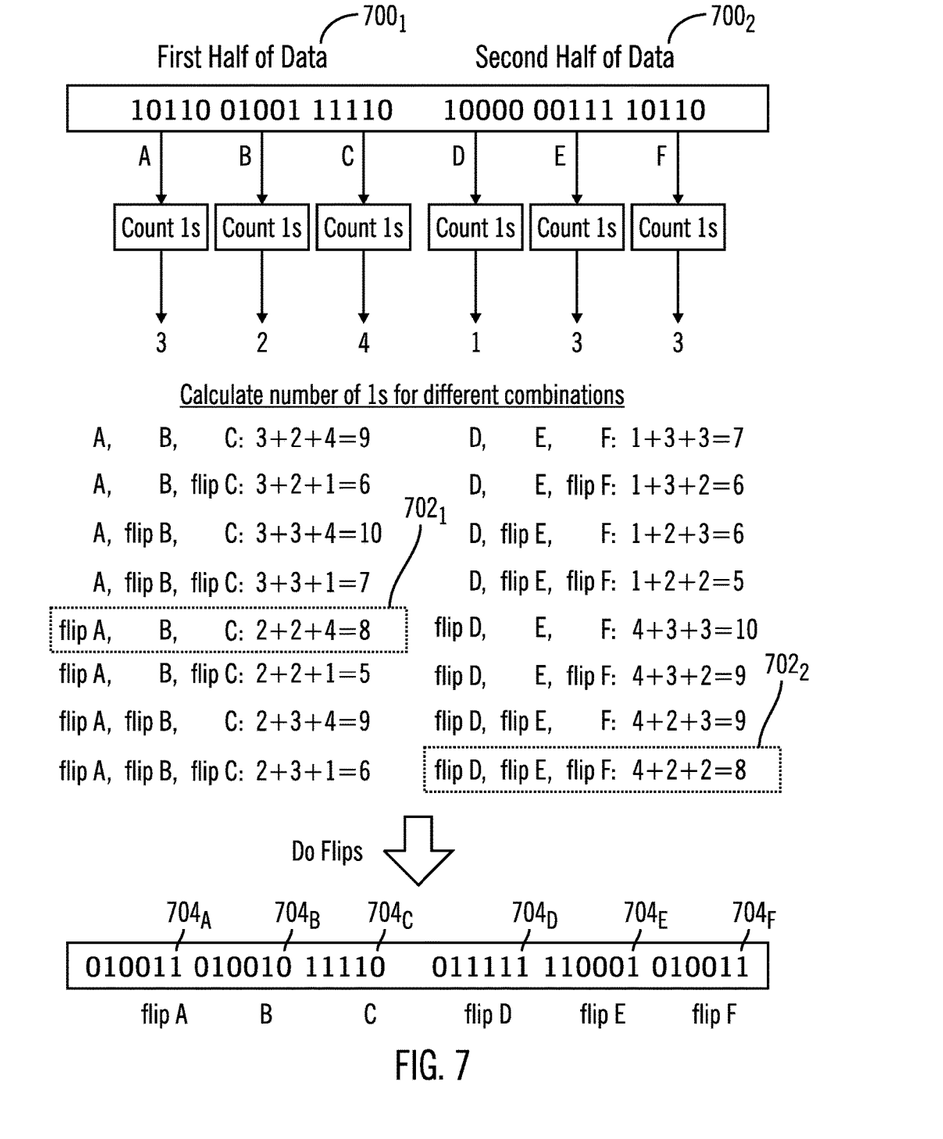

FIG. 7 illustrates an example of the writing operations of FIG. 6, where two sets of bits $700_1$, $700_2$ are each broken down into subsets A, B, C, D, E, F of bits. The 1s in different combinations of the subsets A, B, C for the first set $700_1$ and subsets D, E, F for the second set $700_2$, having their bits flipped or not flipped, are counted. And the combination $702_1$, $702_2$ in each set $700_1$, $700_2$ is selected having closest to an equal number of 0s and 1s, or eight 1s, based on flipping or not flipping any of the subsets A, B, C and D, E, F in each set $700_1$ and $700_2$, respectively. The flag bit $704_A$, $704_B$, $704_C$, $704_D$, $704_E$, $704_F$ bit is appended to each subset A, B, C, D, E, F indicating whether the subset is flipped or not flipped. Parity may then be calculated on the result 706.

With the described operations of FIG. 6, a determination of which subsets of bits in the set to flip is selected to select a combination having 1s and 0s being equal or closest to being equal. By flipping bits in the set to provide an equal number or closest to equal number of 1s and 0s, drift can be detected with the fewest number of bits drifting in storage. For instance, if a combination of subsets to flip or not flip is selected to provide an equal number of 1s and 0s, then drift would be detected if just one 1 bit drifted to zero, because the read bits would have just one more number of 0s than 1s due to the drifting of just one bit. If the number of 1s and 0 are not equal, then drift is detected upon the difference in 1 bits drifting.

In the example of the described embodiment, there are three subsets of a set. However, if more subsets and flag bits are provided, then more fine grained control of flipping may be performed to increase the likelihood that flipping of subsets results in as close as possible to an equal number of 1s and 0s, which provides the most optimal opportunity for detecting drift.

Figure 8:
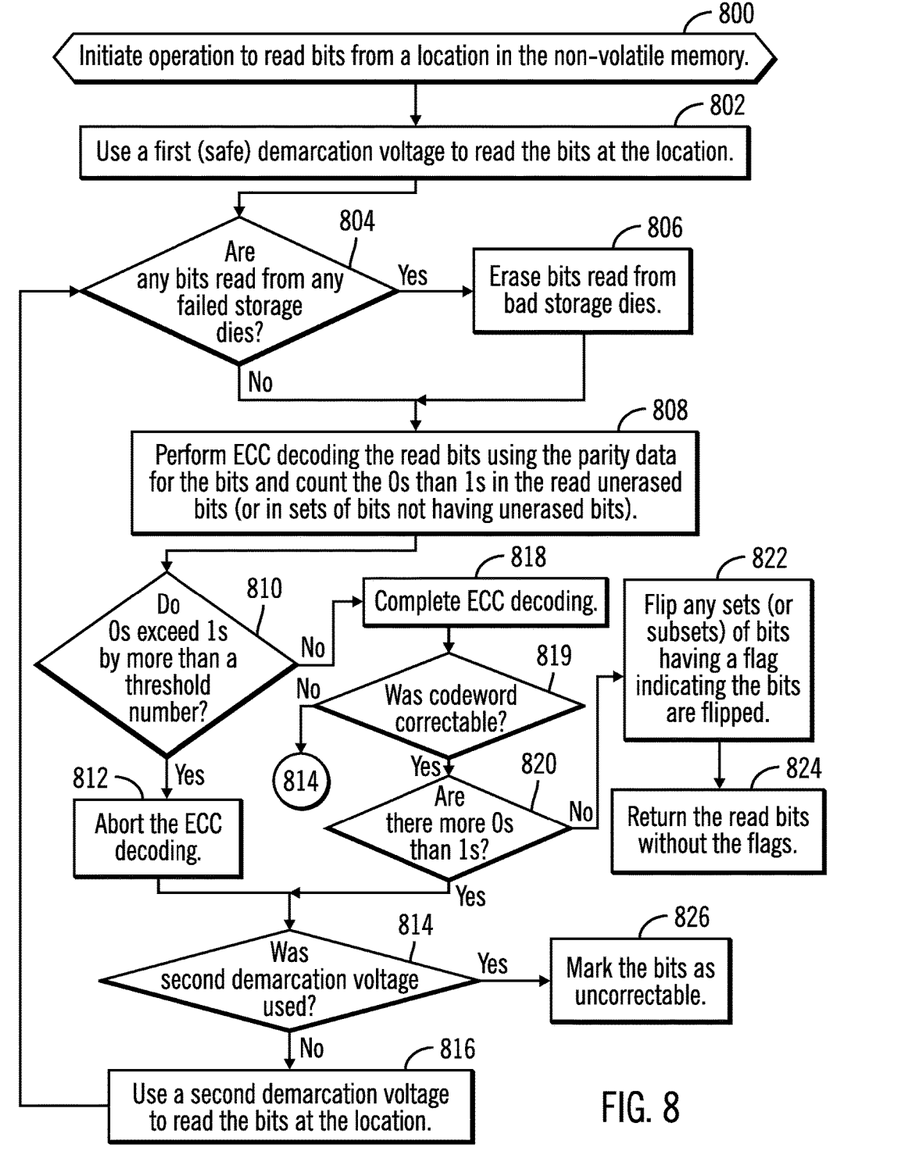
FIG. 8 illustrates an embodiment of operations to read bits from a non-volatile memory.

FIG. 8 illustrates an embodiment of operations performed by the encoder/decoder 115 to read bits from a location in the non-volatile memory mapping to storage dies $106_1$, $106_2 \ldots 106_n$. Upon initiating (at block 800) an operation to read the bits, a first (safe) demarcation voltage is used to read (at bock 802) the bits at the location. If (at block 804) any of the read bits are from failed storage dies $106_1$, $106_2 \ldots 106_n$, then the read bits from bad or failed storage dies $106_1$, $106_2 \ldots 106_n$ are erased. If (at block 804) no bits are read from failed dies or after erasing bits from failed dies (at block 806), ECC decoding is performed (at block 808) on the read bits using the parity data for the bits and, while ECC decoding, the 0s and 1s in the read unerased bits are counted. In an alternative embodiment, if there are multiple sets, 1s and 0s are only counted from one of the sets having no failed dies. If (at block 810) there are more 0s than 1s by a threshold such that the ECC decode is expected to result in an uncorrectable error, then the encoder/decoder 115 indicates that drift of 1s to 0s has occurred because more 1s than 0s were written, and the ECC decoding is aborted (at block 812). If there are more 1s than 0s, i.e., no drift has occurred, then the ECC decoding is completed (at block 818). If (at block 819) the codeword was correctable, then a determination is made (at block 820) whether there are more 0s than 1s. If there are more 0s than 1s (from the yes branch of block 820) or after aborting the ECC decoding (at block 812), the ECC encoder/decoder 115 determines (at block 814) whether the second demarcation voltage was previously used to read the read bits from the location. If not yet used, then the second demarcation voltage, which may be the unsafe voltage, is used (at block 816) to read the bits at the location and control proceeds back to block 804 to determine whether there was drifting. If (at block 814) drifting is detected after using the second demarcation voltage (from the no branch of block 814), the bits are marked (at block 826) as uncorrectable.

If (at block 820) there are more 1s than 0s after completing decoding, then any sets or subsets of bits having a flag indicating flipping are flipped (at block 822) from 0 to 1 or 1 to 0, and the read bits are returned (at block 824).

With the embodiment of FIG. 8, if the read stream is detected to have more 0s than 1s, then the ECC decoding is halted, thus reducing write latency by terminating ECC decoding if drifting is detected. The second demarcation voltage may then be used at this point to try to read the drifted values, but if drift is still detected, ECC decoding is again aborted to avoid latency in the determination to mark the bits as uncorrectable due to drift detected as a result of detecting more 0s than 1s, when more is were stored. Described embodiments thus reduce the write latency in the encoder/decoder 115 of a non-volatile memory device by eliminating multiple ECC decoding operations upon detecting drift when more 0s than 1s are counted when the bits were encoded to have more 1s than 0s.

Figure 9:
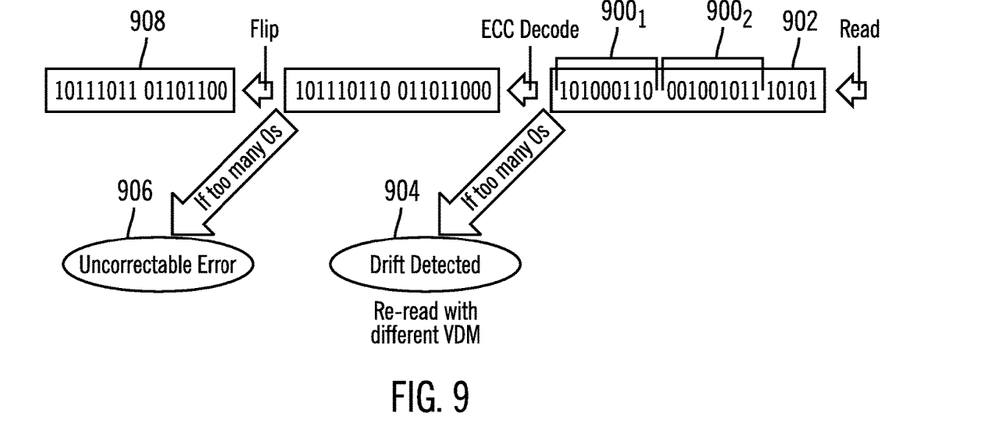
FIGS. 9 and 10 illustrate examples of reading sets of bits as performed in the embodiment of FIG. 8.

FIG. 9 illustrates an example of the reading operation of FIG. 8. Upon reading a string of two sets of bits $900_1$, $900_2$, including the flag bit as the last bit, with parity 902, if, while ECC decoding the read bits, more 0s than 1s are counted, then drift is detected 904, the ECC decoding is aborted and the bits $900_1$, $900_2$, 902 are re-read with a second higher demarcation voltage. If after the higher unsafe demarcation voltage is used, there are still too many 0s, an uncorrectable error is indicated 906, else the decoded bits 908 are returned. In this way, the described embodiments check for silent data corruption (SDC) when bits transition from 1 to 0, resulting in the codeword being marked uncorrectable even if decoded.

Figure 10:
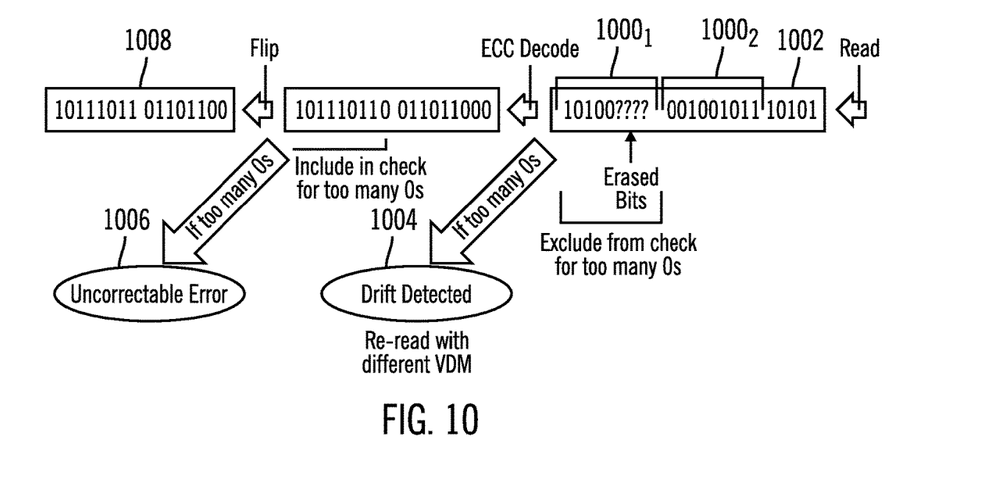

FIG. 10 illustrates a further example of the reading operation of FIG. 8. A string of two sets of bits $1000_1$, $1000_2$ are read, including the flag bit as the last bit, with parity 902, where bits $1000_1$ include erased bits if read from a failed storage die $106_i$. If, while ECC decoding the read bits, more 0s than 1s are counted, then drift is detected 1004, the ECC decoding is aborted and the bits $1000_1$, $1000_2$, 1002 are re-read with a second higher demarcation voltage. If after the second demarcation voltage is used, there are still too many 0s, an uncorrectable error is indicated 1006, else the decoded bits 1008 are returned.

Figure 11:
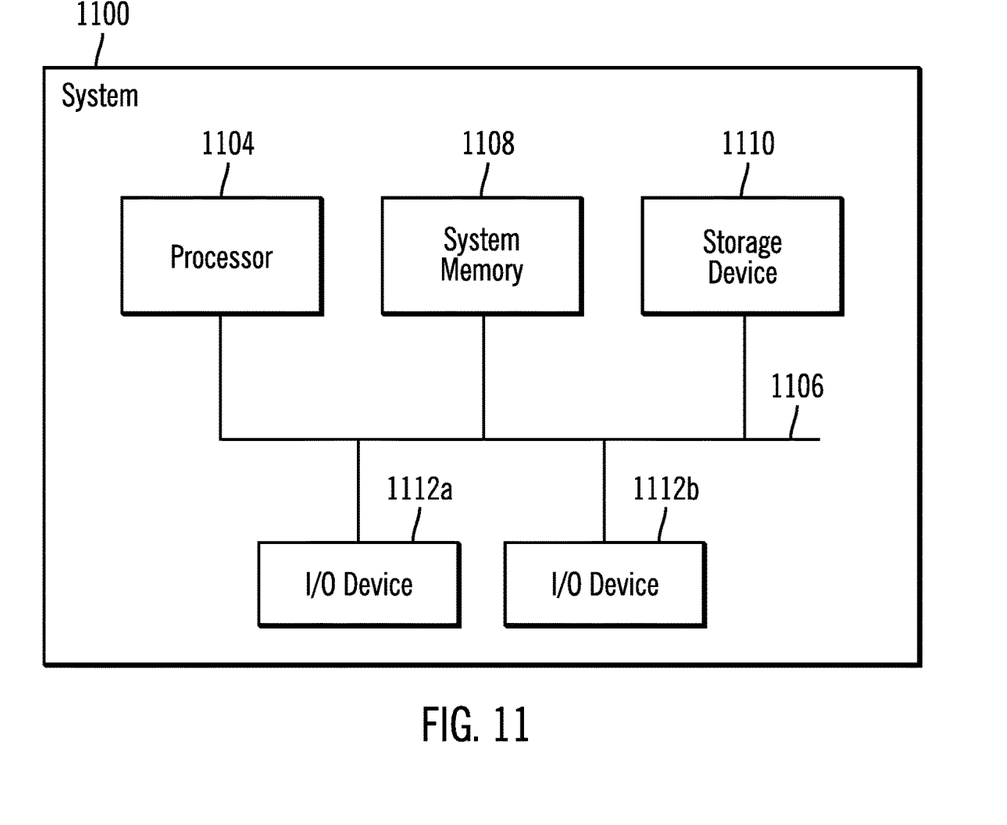
FIG. 11 illustrates an embodiment of a system in which the memory device of FIG. 1 may be deployed.

FIG. 11 illustrates an embodiment of a system 1100 in which the non-volatile memory storage device 100 may be deployed as the system memory device 1108 and/or a storage device 1110. The system includes a processor 1104 that communicates over a bus 1106 with a system memory device 1108 in which programs, operands and parameters being executed are cached, and a storage device 1110, which may comprise a solid state drive (SSD) that stores programs and user data that may be loaded into the system memory 1108 for execution. The processor 1104 may also communicate with Input/Output (I/O) devices 1112a, 1112b, which may comprise input devices (e.g., keyboard, touchscreen, mouse, etc.), display devices, graphics cards, ports, network interfaces, etc. The memory 1108 and storage device 1110 may be coupled to an interface on the system 1100 motherboard, mounted on the system 1100 motherboard, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i and n, etc., are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus for writing and reading data at a non-volatile memory, comprising: an encoder/decoder unit to: determine whether bits to write have more of a first value than a second value, wherein each bit has the first value or a second value; flip each of the bits to another of the first or second value in response to determining that the bits have more of the first value than the second value; indicate whether the bits were flipped or not flipped; calculate parity for the bits; write the bits and the parity for the bits to a location in the non-volatile memory; read bits at the location in the non-volatile memory; and flip each of the bits having the first value to the second value and each of the bits having the second value to the first value in response to indication that the bits were flipped.

In Example 2, the subject matter of examples 1 and 3-11 can optionally include that the first value comprises a reset value and the second value comprises a set value, wherein over time the set value drifts toward the reset value.

In Example 3, the subject matter of examples 1, 2, and 4-11 can optionally include that the read bits comprise first read bits, wherein the encoder/decoder unit is further to: use a first demarcation voltage to read the first read bits at the location; determine whether the first read bits have more of the first value than the second value; use a second demarcation voltage, higher than the first demarcation voltage, to read second read bits at the location in response to determining that the first read bits have more of the first value than the second value; determine whether the second read bits have more of the first value than the second value; and mark the second read bits as having an uncorrectable error in response to determining that the second read bits have more of the first value than the second value.

In Example 4, the subject matter of examples 1-3 and 5-11 can optionally include that the read bits comprise first read bits, wherein the encoder/decoder unit is further to: use a first demarcation voltage to read the first read bits at the location; erase bits in the first read bits read from failed storage dies in the non-volatile memory; determine whether the first read bits that are not erased have more of the first value than the second value; read second read bits from the location at the non-volatile memory using a second demarcation voltage higher than the first demarcation voltage in response to determining that the first read bits that are not erased have more of the first value than the second value; erase bits in the second read bits read from failed storage dies in the non-volatile memory; determine whether the second read bits have more of the first value than the second value; and marking the bits as having an uncorrectable error in response to determining that the second read bits have more of the first value than the second value.

In Example 5, the subject matter of examples 1-4 and 6-11 can optionally include that the encoder/decoder unit is further to: determine whether the read bits have more of the first value than the second value; and complete a decode of the read bits using the parity for the bits in response to determining that the read bits have more of the second value than the first value, wherein the flipping of each of the bits is performed after decoding the read bits.

In Example 6, the subject matter of examples 1-5 and 7-11 can optionally include that a flag is provided for bits indicating whether the bits were flipped or not flipped, and wherein the flag is written to the non-volatile memory following the bits.

In Example 7, the subject matter of examples 1-6 and 8-11 can optionally include that the bits are not flipped in response to determining that the bits have more of the second value than the first value, wherein the parity is calculated after determining whether to flip or not flip the bits.

In Example 8, the subject matter of examples 1-7 and 9-11 can optionally include that to flip each of the bits comprises: apply a string of bits to the bits and the calculated parity to flip the bits and modify the parity for the flipped bits in response to determining that the bits have more of the first value than the second value.

In Example 9, the subject matter of examples 1-8 and 10-11 can optionally include that the bits to write comprise a first set of bits and a second set of bits, wherein to determine whether the bits have more of the first value than the second value, calculate the parity, and write the bits are each performed for the first set of bits and the second set of bits.

In Example 10, the subject matter of examples 1-9 and 11 can optionally include that the encoder/decoder unit is further to: select a string of a plurality of strings to apply to the first and the second sets of bits to flip at least one of the first set of bits and the second set of bits and modify the parity for the first and the second sets of bits based on determining whether the first and the second sets of bits have more of the first value than the second value; and apply the selected string to the first set of bits and the second set of bits to produce the bits that are written to the non-volatile memory.

In Example 11, the subject matter of examples 1-10 can optionally include that to flip each of the bits and to indicate that the bits are flipped or not flipped comprises: determine combinations of subsets of the bits with all the bits in each of the subsets flipped or not flipped; for each of the combinations, select a combination of the combinations of the subsets having the first and the second values closest to being equal; and for each of the subsets in the selected combination, indicate whether the bits in a subset of the subsets in the selected combination are flipped or not flipped; and wherein to flip each of the read bits comprises: for each subset of bits in the read bits, flip the bits in the subset in response to indication that the bits for the subset are flipped.

Example 12 is a non-volatile memory storage device, comprising: non-volatile memory storage dies; a processing unit managing operations at the storage device; and an encoder/decoder unit to: determine whether bits to write have more of a first value than a second value, wherein each bit has the first value or a second value; flip each of the bits to another of the first or second value in response to determining that the bits have more of the first value than the second value; indicate whether the bits were flipped or not flipped; calculate parity for the bits; write the bits and the parity for the bits to a location in at least one of the non-volatile memory storage dies; read bits at the location in the non-volatile memory storage dies; and flip each of the bits having the first value to the second value and each of the bits having the second value to the first value in response to indication that the bits were flipped.

In Example 13, the subject matter of examples 12 and 14-18 can optionally include that the read bits comprise first read bits, wherein the encoder/decoder unit is further to: use a first demarcation voltage to read the first read bits at the location; determine whether the first read bits have more of the first value than the second value; use a second demarcation voltage, higher than the first demarcation voltage, to read second read bits at the location in response to determining that the first read bits have more of the first value than the second value; determine whether the second read bits have more of the first value than the second value; and mark the second read bits as having an uncorrectable error in response to determining that the second read bits have more of the first value than the second value.

In Example 14, the subject matter of examples 12, 13, and 15-18 can optionally include that a flag is provided for bits indicating whether the bits were flipped or not flipped, and wherein the flag is written to the non-volatile memory storage dies following the bits.

In Example 15, the subject matter of examples 12-14 and 16-18 can optionally include that the bits are not flipped in response to determining that the bits have more of the second value than the first value, wherein the parity is calculated after determining whether to flip or not flip the bits.

In Example 16, the subject matter of examples 12-15 and 17-18 can optionally include that the bits to write comprise a first set of bits and a second set of bits, wherein to determine whether the bits have more of the first value than the second value, calculate the parity, and write the bits are each performed for the first set of bits and the second set of bits.

In Example 17, the subject matter of examples 12-16 and 18 can optionally include that the encoder/decoder unit is further to: select a string of a plurality of strings to apply to the first and the second sets of bits to flip at least one of the first set of bits and the second set of bits and modify the parity for the first and the second sets of bits based on determining whether the first and the second sets of bits have more of the first value than the second value; and apply the selected string to the first set of bits and the second set of bits to produce the bits that are written to the non-volatile memory.

In Example 18, the subject matter of examples 12-17 can optionally include that to flip each of the bits and to indicate that the bits are flipped or not flipped comprises: determine combinations of subsets of the bits with all the bits in each of the subsets flipped or not flipped; for each of the combinations, select a combination of the combinations of the subsets having the first and the second values closest to being equal; and for each of the subsets in the selected combination, indicate whether the bits in a subset of the subsets in the selected combination are flipped or not flipped; and wherein to flip each of the read bits comprises: for each subset of bits in the read bits, flip the bits in the subset in response to indication that the bits for the subset are flipped.

Example 19 is a method for writing and reading data at a non-volatile memory, comprising: determining whether bits to write have more of a first value than a second value, wherein each bit has the first value or a second value; flipping each of the bits to another of the first or second value in response to determining that the bits have more of the first value than the second value; indicating whether the bits were flipped or not flipped; calculating parity for the bits; writing the bits and the parity for the bits to a location in the non-volatile memory; reading bits at the location in the non-volatile memory; and flipping each of the bits having the first value to the second value and each of the bits having the second value to the first value in response to indication that the bits were flipped.

In Example 20, the subject matter of examples 19 and 21-25 can optionally include that the read bits comprise first read bits, further comprising: using a first demarcation voltage to read the first read bits at the location; determining whether the first read bits have more of the first value than the second value; using a second demarcation voltage, higher than the first demarcation voltage, to read second read bits at the location in response to determining that the first read bits have more of the first value than the second value; determining whether the second read bits have more of the first value than the second value; and marking the second read bits as having an uncorrectable error in response to determining that the second read bits have more of the first value than the second value.

In Example 21, the subject matter of examples 19, 20, and 22-25 can optionally include that a flag is provided for bits indicating whether the bits were flipped or not flipped, and wherein the flag is written to the non-volatile memory following the bits.

In Example 22, the subject matter of examples 19-21 and 23-25 can optionally include that the bits are not flipped in response to determining that the bits have more of the second value than the first value, wherein the parity is calculated after determining whether to flip or not flip the bits.

In Example 23, the subject matter of examples 19-22 and 24-25 can optionally include that the bits to write comprise a first set of bits and a second set of bits, wherein to determine whether the bits have more of the first value than the second value, provide the flag, calculate the parity, and write the bits are each performed for the first set of bits and the second set of bits.

In Example 24, the subject matter of examples 19-23 and 25 can optionally include that selecting a string of a plurality of strings to apply to the first and the second sets of bits to flip at least one of the first set of bits and the second set of bits and modify the parity for the first and the second sets of bits based on determining whether the first and the second sets of bits have more of the first value than the second value; and applying the selected string to the first set of bits and the second set of bits to produce the bits that are written to the non-volatile memory.

In Example 25, the subject matter of examples 19-24 can optionally include that the flipping each of the bits comprises: determining combinations of subsets of the bits with all the bits in each of the subsets flipped or not flipped; for each of the combinations, selecting a combination of the combinations of the subsets having the first and the second values closest to being equal; and for each of the subsets in the selected combination, indicating whether the bits in a subset of the subsets in the selected combination are flipped or not flipped; and wherein the flipping each of the read bits comprises: for each subset of bits in the read bits, flipping the bits in the subset in response to indication that the bits for the subset are flipped.

Example 26 is an apparatus for writing and reading data at a non-volatile memory, comprising: means for determining whether bits to write have more of a first value than a second value, wherein each bit has the first value or a second value; means for flipping each of the bits to another of the first or second value in response to determining that the bits have more of the first value than the second value; means for indicating whether the bits were flipped or not flipped; means for calculating parity for the bits; means for writing the bits and the parity for the bits to a location in the non-volatile memory; means for reading bits at the location in the non-volatile memory; and means for flipping each of the bits having the first value to the second value and each of the bits having the second value to the first value in response to indication that the bits were flipped.

Example 27 is a machine-readable storage including machine-readable instructions, when executed, to implement a method or realize an apparatus as claimed in any preceding claim.

What is claimed:

1. An apparatus for writing and reading data at a non-volatile memory, comprising:
an encoder/decoder unit to:
determine whether bits to write have more of a first value than a second value, wherein each bit has the first value or the second value;
flip each of the bits to change any bits having the first value to the second value and change any of the bits having the second value to the first value in response to determining that the bits have more of the first value than the second value;
indicate whether the bits were flipped or not flipped;
calculate parity for the bits;
write the bits and the parity for the bits to a location in the non-volatile memory;
read bits at the location in the non-volatile memory; and
flip each of the read bits having the first value to the second value and each of the read bits having the second value to the first value in response to indication that the read bits were flipped.

2. The apparatus of claim 1, wherein the first value comprises a reset value and the second value comprises a set value, wherein over time the set value drifts toward the reset value.

3. The apparatus of claim 1, wherein the read bits comprise first read bits, wherein the encoder/decoder unit is further to:
use a first demarcation voltage to read the first read bits at the location;
determine whether the first read bits have more of the first value than the second value;
use a second demarcation voltage, higher than the first demarcation voltage, to read second read bits at the location in response to determining that the first read bits have more of the first value than the second value;
determine whether the second read bits have more of the first value than the second value; and
mark the second read bits as having an uncorrectable error in response to determining that the second read bits have more of the first value than the second value.

4. The apparatus of claim 1, wherein the read bits comprise first read bits, wherein the encoder/decoder unit is further to:
use a first demarcation voltage to read the first read bits at the location;
erase bits in the first read bits read from failed storage dies in the non-volatile memory;
determine whether the first read bits that are not erased have more of the first value than the second value;
read second read bits from the location at the non-volatile memory using a second demarcation voltage higher than the first demarcation voltage in response to determining that the first read bits that are not erased have more of the first value than the second value;
erase bits in the second read bits read from failed storage dies in the non-volatile memory;
determine whether the second read bits have more of the first value than the second value; and
marking the bits as having an uncorrectable error in response to determining that the second read bits have more of the first value than the second value.

5. The apparatus of claim 1, wherein the encoder/decoder unit is further to:
determine whether the read bits have more of the first value than the second value; and
complete a decode of the read bits using the parity for the bits in response to determining that the read bits have more of the second value than the first value, wherein the flipping of each of the bits is performed after decoding the read bits.

6. The apparatus of claim 1, wherein a flag is provided for the bits indicating whether the bits were flipped or not flipped, and wherein the flag is written to the non-volatile memory following the bits.

7. The apparatus of claim 1, wherein the bits are not flipped in response to determining that the bits have more of the second value than the first value, wherein the parity is calculated after determining whether to flip or not flip the bits.

8. The apparatus of claim 1, wherein to flip each of the bits comprises:
apply a string of bits to the bits and the calculated parity to flip the bits and modify the parity for the flipped bits in response to determining that the bits have more of the first value than the second value.

9. The apparatus of claim 1, wherein the bits to write comprise a first set of bits and a second set of bits, wherein to determine whether the bits have more of the first value than the second value, calculate the parity, and write the bits are each performed for the first set of bits and the second set of bits.

10. The apparatus of claim 9, wherein the encoder/decoder unit is further to:
select a string of a plurality of strings to apply to the first and the second sets of bits to flip at least one of the first set of bits and the second set of bits and modify the parity for the first and the second sets of bits based on determining whether the first and the second sets of bits have more of the first value than the second value; and
apply the selected string to the first set of bits and the second set of bits to produce the bits that are written to the non-volatile memory.

11. The apparatus of claim 1,
wherein to flip each of the bits and to indicate that the bits are flipped or not flipped comprises:
determine combinations of subsets of the bits with all the bits in each of the subsets flipped or not flipped;
for each of the combinations, select a combination of the combinations of the subsets having the first and the second values closest to being equal; and
for each of the subsets in the selected combination, indicate whether the bits in a subset of the subsets in the selected combination are flipped or not flipped; and
wherein to flip each of the read bits comprises:
for each subset of bits in the read bits, flip the bits in the subset in response to indication that the bits for the subset are flipped.

12. A non-volatile memory storage device, comprising:
non-volatile memory storage dies;
a processing unit managing operations at the non-volatile memory storage device; and
an encoder/decoder unit to:
determine whether bits to write have more of a first value than a second value, wherein each bit has the first value or the second value;
flip each of the bits to change any bits having the first value to the second value and change any of the bits having the second value to the first value in response to determining that the bits have more of the first value than the second value;
indicate whether the bits were flipped or not flipped;
calculate parity for the bits;
write the bits and the parity for the bits to a location in at least one of the non-volatile memory storage dies;
read bits at the location in the non-volatile memory storage dies; and
flip each of the read bits having the first value to the second value and each of the read bits having the second value to the first value in response to indication that the read bits were flipped.

13. The non-volatile memory storage device of claim 12, wherein the read bits comprise first read bits, wherein the encoder/decoder unit is further to:
use a first demarcation voltage to read the first read bits at the location;
determine whether the first read bits have more of the first value than the second value;
use a second demarcation voltage, higher than the first demarcation voltage, to read second read bits at the location in response to determining that the first read bits have more of the first value than the second value;
determine whether the second read bits have more of the first value than the second value; and
mark the second read bits as having an uncorrectable error in response to determining that the second read bits have more of the first value than the second value.

14. The non-volatile memory storage device of claim 12, wherein a flag is provided for the bits indicating whether the bits were flipped or not flipped, and wherein the flag is written to the non-volatile memory storage dies following the bits.

15. The non-volatile memory storage device of claim 12, wherein the bits are not flipped in response to determining that the bits have more of the second value than the first value, wherein the parity is calculated after determining whether to flip or not flip the bits.

16. The non-volatile memory storage device of claim 12, wherein the bits to write comprise a first set of bits and a second set of bits, wherein to determine whether the bits have more of the first value than the second value, calculate the parity, and write the bits are each performed for the first set of bits and the second set of bits.

17. The non-volatile memory storage device of claim 16, wherein the encoder/decoder unit is further to:
select a string of a plurality of strings to apply to the first and the second sets of bits to flip at least one of the first set of bits and the second set of bits and modify the parity for the first and the second sets of bits based on determining whether the first and the second sets of bits have more of the first value than the second value; and
apply the selected string to the first set of bits and the second set of bits to produce the bits that are written to the non-volatile memory storage device.

18. The non-volatile memory storage device of claim 12, wherein to flip each of the bits and to indicate that the bits are flipped or not flipped comprises:
determine combinations of subsets of the bits with all the bits in each of the subsets flipped or not flipped;
for each of the combinations, select a combination of the combinations of the subsets having the first and the second values closest to being equal; and
for each of the subsets in the selected combination, indicate whether the bits in a subset of the subsets in the selected combination are flipped or not flipped; and
wherein to flip each of the read bits comprises:
for each subset of bits in the read bits, flip the bits in the subset in response to indication that the bits for the subset are flipped.

19. A method for writing and reading data at a non-volatile memory, comprising:
determining whether bits to write have more of a first value than a second value, wherein each bit has the first value or the second value;
flipping each of the bits to change any bits having the first value to the second value and change any of the bits having the second value to the first value in response to determining that the bits have more of the first value than the second value;
indicating whether the bits were flipped or not flipped;
calculating parity for the bits;
writing the bits and the parity for the bits to a location in the non-volatile memory;
reading bits at the location in the non-volatile memory; and
flipping each of the read bits having the first value to the second value and each of the read bits having the second value to the first value in response to indication that the read bits were flipped.

20. The method of claim 19, wherein the read bits comprise first read bits, further comprising:
using a first demarcation voltage to read the first read bits at the location;
determining whether the first read bits have more of the first value than the second value;
using a second demarcation voltage, higher than the first demarcation voltage, to read second read bits at the location in response to determining that the first read bits have more of the first value than the second value;
determining whether the second read bits have more of the first value than the second value; and
marking the second read bits as having an uncorrectable error in response to determining that the second read bits have more of the first value than the second value.

21. The method of claim 19, wherein a flag is provided for bits indicating whether the bits were flipped or not flipped, and wherein the flag is written to the non-volatile memory following the bits.

22. The method of claim 19, wherein the bits are not flipped in response to determining that the bits have more of the second value than the first value, wherein the parity is calculated after determining whether to flip or not flip the bits.

23. The method of claim 19, wherein the bits to write comprise a first set of bits and a second set of bits, wherein to determine whether the bits have more of the first value than the second value, calculate the parity, and write the bits are each performed for the first set of bits and the second set of bits.

24. The method of claim 23, further comprising:
- selecting a string of a plurality of strings to apply to the first and the second sets of bits to flip at least one of the first set of bits and the second set of bits and modify the parity for the first and the second sets of bits based on determining whether the first and the second sets of bits have more of the first value than the second value; and
- applying the selected string to the first set of bits and the second set of bits to produce the bits that are written to the non-volatile memory.

25. The method of claim 19,
- wherein the flipping each of the bits comprises:
- determining combinations of subsets of the bits with all the bits in each of the subsets flipped or not flipped;
- for each of the combinations, selecting a combination of the combinations of the subsets having the first and the second values closest to being equal; and
- for each of the subsets in the selected combination, indicating whether the bits in a subset of the subsets in the selected combination are flipped or not flipped; and
- wherein the flipping each of the read bits comprises:
  - for each subset of bits in the read bits, flipping the bits in the subset in response to indication that the bits for the subset are flipped.

\* \* \* \* \*